US008472233B1

(12) United States Patent
Krishnamoorthy et al.

(10) Patent No.: US 8,472,233 B1
(45) Date of Patent: *Jun. 25, 2013

(54) CIRCUITS AND METHODS FOR MULTIPLE PROGRAMMABLE MEMORY USING ONE-TIME PROGRAMMABLE MEMORY

(75) Inventors: Ravishanker Krishnamoorthy, Singapore (SG); Foo Leng Leong, Singapore (SG)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/461,624

(22) Filed: May 1, 2012

Related U.S. Application Data

(63) Continuation of application No. 12/764,837, filed on Apr. 21, 2010, now Pat. No. 8,174,863.

(51) Int. Cl.
*G11C 17/00* (2006.01)

(52) U.S. Cl.
USPC ........................................ 365/96; 365/189.16

(58) Field of Classification Search
USPC .............................................. 365/96, 189.16
See application file for complete search history.

(56) References Cited

U.S. PATENT DOCUMENTS

| 6,318,965 B1 | 11/2001 | Nair | |
| 6,646,912 B2 * | 11/2003 | Hurst et al. | 365/175 |
| 7,499,304 B2 * | 3/2009 | Scheuerlein et al. | 365/148 |
| 7,499,355 B2 * | 3/2009 | Scheuerlein et al. | 365/201 |
| 8,174,863 B1 * | 5/2012 | Krishnamoorthy et al. | 365/96 |
| 2002/0196659 A1 * | 12/2002 | Hurst et al. | 365/175 |
| 2003/0011332 A1 | 1/2003 | Mays | |
| 2005/0254799 A1 | 11/2005 | Murara et al. | |
| 2008/0025067 A1 * | 1/2008 | Scheuerlein et al. | 365/148 |
| 2008/0025068 A1 * | 1/2008 | Scheuerlein et al. | 365/148 |
| 2008/0025078 A1 * | 1/2008 | Scheuerlein et al. | 365/163 |
| 2011/0157956 A1 | 6/2011 | Rotem | |

FOREIGN PATENT DOCUMENTS

| JP | 2002-058280 A | 2/2002 |
| JP | 2004-120980 A | 4/2004 |

* cited by examiner

*Primary Examiner* — Tuan T. Nguyen

(57) ABSTRACT

Circuits and methods for utilizing multiple programmable memory using one-time programmable (OTP) memory in a device controller. The device controller generally includes a plurality of OTP memories, each capable of being programmed once and only once; a state machine configured to enable writing updated parameter information to an available OTP memory and to provide a control signal indicating a next OTP memory to which next received data are to be written, and read logic coupled to the plurality of OTP memories, the read logic configured to read an output from a most recently programmed OTP memory. The method generally includes receiving updated parameter information to be stored in the memory, programming one of a plurality of one-time programmable (OTP) memories with the updated parameter information, indicating an availability of a next OTP memory, and reading an output from a most recently programmed OTP memory.

20 Claims, 8 Drawing Sheets

FIG. 3

| OTP State Chart (n = 3) (0 = low) (1 = high) | | | |
|---|---|---|---|
| CS1 | CS2 | CS3 | OTP selected |
| 0 | 0 | 0 | OTP1 |
| 1 | 0 | 0 | OTP2 |
| 1 | 1 | 0 | OTP3 |

US 8,472,233 B1

CIRCUITS AND METHODS FOR MULTIPLE PROGRAMMABLE MEMORY USING ONE-TIME PROGRAMMABLE MEMORY

CROSS-REFERENCE TO RELATED APPLICATIONS

This application is a continuation of U.S. patent application Ser. No. 12/764,837, filed Apr. 21, 2010, titled "Circuits and Methods for Multiple Programmable Memory Using One-Time Programmable Memory", which is incorporated by reference in its entirety for all purposes.

FIELD OF THE INVENTION

The present invention generally relates to the field of data storage. More specifically, embodiments of the present invention pertain to circuits, architectures, systems, methods, algorithms and software for "reprogramming" one-time programmable (OTP) memory.

BACKGROUND

In modern electronic devices, memory is often used to program one of a plurality of parameter values to implement certain operations of a device, such as an integrated circuit (IC) or circuit board (CB). Some devices can be customized, so that the parameter value(s) are hardwired or programmed into on-board memory. The design costs of a custom IC can be relatively expensive, but may be justifiable for some end products (e.g., those produced in high volumes and/or requiring a substantial amount of processing power and memory capacity). Some custom IC's include on-board memory for customization of a specific end product which, in turn, ensures the most efficient use of IC resources (e.g., the memory available is sufficient for the device requirements). However, for other end products, small manufacturing volumes may not justify the high design and manufacturing costs associated with using custom ICs or on-board programmable memory.

Solutions associated with custom made devices include the use of volatile memory and non-volatile memory. Volatile memory (e.g., DRAM, SRAM, flip-flops, etc.) is less expensive than non-volatile memory, but it is dependent upon continuous power to maintain the programmed values in the memories. Therefore, volatile memory does not immediately provide programmed device parameters after a power loss, and the programmed values should be stored in non-volatile memory (either on-board or elsewhere in the system). As a result, device parameters stored in volatile memory (e.g., specific usage patterns such as recalling a last chapter played from a DVD-ROM in a DVD player, or a last channel viewed in a television receiver) must be reloaded every time power is restored.

Non-volatile memory (e.g., flash memory), however, is not dependent upon continuous power, and is oftentimes manufactured to allow up to $10^4$ cycles of reprogrammability. However, in certain end devices, such reprogrammability is not needed or desired by end users. For example, a simple three-phase motor controller does not necessarily require the advantages of flash memory (e.g., high-speed reading/writing capabilities, high storage capacity, etc.), nor does the manufacturer of the motor or motor controller necessarily desire such capabilities. Such memory, however, is practical for applications that need device parameter values immediately upon the application of power (e.g., TV volume settings, a last played chapter in a DVD-ROM prior to a loss of power, etc.).

In such devices, flash memory (which is larger and more expensive than volatile memory) may be used to provide the desired parameter data storage capabilities.

In other devices, certain predefined parameters are utilized throughout the entire lifespan of the particular device and require no modification. In such instances, one-time programmable (OTP) memories are utilized to store such parameters. Typical OTP memories include, for example, hardwired memory, mask ROM, fuses, EPROM, etc. Due to their relative simplicity, OTP memory provides the least expensive option for such devices, but has the disadvantage of not being reprogrammable. That is, once programmed, the parameters on the IC or circuit board cannot be modified. Thus, OTP memory does not allow end users to modify a device to suit their specific needs, or permit a manufacturer to reprogram the devices for sale to or use by another customer.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY

Embodiments of the present invention relate to circuitry, architectures, systems, methods, algorithms and software for multiple programmable memory using one-time programmable (OTP) memory. In one aspect, a fan controller generally comprises (a) a plurality of OTP memories, wherein each of the plurality of OTP memories is capable of being programmed once and only once, (b) a state machine configured to enable writing updated parameter information to an available OTP memory and to provide an OTP select signal indicating a next OTP memory to which next updated parameter information is to be written, and (c) port logic coupled to the plurality of OTP memories and configured to provide an output from a most recently programmed OTP memory.

In a further aspect, the method generally comprises (1) receiving updated parameter information to be stored in a one-time programmable (OTP) memory, (2) programming one of a plurality of OTP memories with the updated parameter information, (3) indicating an availability of a next one of the plurality of OTP memories, and (4) reading an output from a most recently programmed OTP memory. The algorithms and/or software are generally configured to implement one or more aspects of the method.

The present disclosure advantageously provides reprogrammability in non-volatile, one-time programmable memories at a reduced cost relative to flash memory or EEPROM. These and other advantages of the present invention will become readily apparent from the detailed description below.

BRIEF DESCRIPTION OF THE DRAWINGS

FIG. 3 is a truth table for control signals applicable to the exemplary memory of FIG. 2.

DETAILED DESCRIPTION

Figure 1:
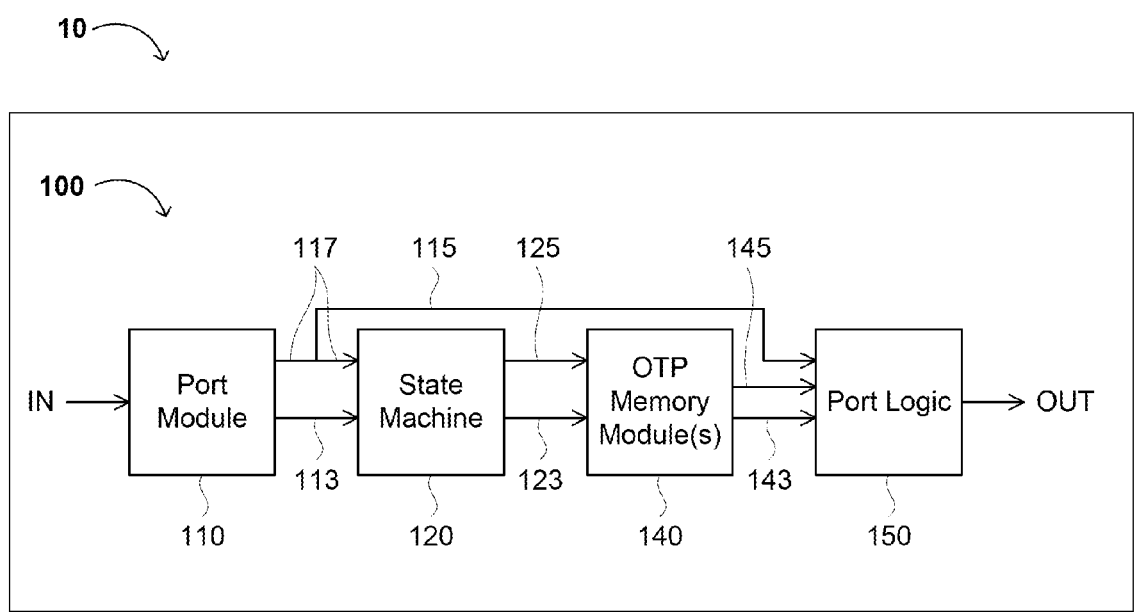
FIG. 1 is a block diagram showing a multiple programmable memory with an OTP memory module according to a first exemplary embodiment.

Reference will now be made in detail to various embodiments of the invention, examples of which are illustrated in the accompanying drawings. While the invention will be described in conjunction with exemplary embodiments provided below, the embodiments are not intended to limit the invention. On the contrary, the invention is intended to cover alternatives, modifications and equivalents that may be included within the scope of the invention as defined by the appended claims. Furthermore, in the following detailed description, numerous specific details are set forth in order to provide a thorough understanding. However, the present invention may be practiced without these specific details. In other instances, well-known methods, procedures, components, and circuits have not been described in detail so as not to unnecessarily obscure aspects of the present disclosure.

Some portions of the detailed descriptions which follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the data processing arts to effectively convey the substance of their work to others skilled in the art. A process, procedure, logic block, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer, data processing system, or logic circuit. It has proven convenient at times, principally for reasons of common usage, to refer to these signals as bits, waves, waveforms, streams, values, elements, symbols, characters, terms, numbers, or the like.

All of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer, data processing system, logic circuit or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "connected to," "coupled with," "coupled to," and "in communication with" (which terms also refer to direct and/or indirect relationships between the connected, coupled and/or communication elements unless the context of the term's use unambiguously indicates otherwise) may be used interchangeably, but these terms are also generally given their art-recognized meanings.

The invention, in its various aspects, will be explained in greater detail below with regard to exemplary embodiments.

An Exemplary Circuit and/or Architecture

In one aspect, the present invention relates to a multiple programmable memory comprising a plurality of one-time programmable (OTP) memories. FIG. 1 shows an exemplary block-level architecture for a multiple programmable memory 100. The multiple programmable memory 100 generally comprises port module 110, state machine 120, OTP memory module 140, and port logic 150.

Port module 110 receives incoming data IN and generally provides the received data to the state machine 120 on data bus 117 and to the port logic 150 on bypass bus 115. Incoming data IN comprises data to be written to the multiple programmable memory 100. In a further embodiment, the port module 110 can also receive an external write enable signal (e.g., from an external source, such as a microprocessor or microcontroller; not shown). The bypass bus 115 to port logic 150 can be the same as or different from the data bus to the state machine 120. Alternatively, bypass bus 115 can be a subset of the signals on data bus 117 when data bus 117 is parallel. Incoming data IN may be serial or parallel, and when it is parallel, it is at least 2 bits wide (e.g., $2^m$ bits wide, where m is an integer of at least 2, such as 3, 4, 5 or more). In one embodiment, the data IN is serial. Data bus 117 may be serial or parallel, and when it is parallel, it is at least 2 bits wide (e.g., $2^n$ bits wide, where n is an integer of at least 2, such as 3, 4, 5, 6 or more). Generally, the bypass bus 115 is the same as or (if the data bus 117 is parallel) a subset of the bits on data bus 117. In one example, the width of the bypass bus 115 is one bit less than the width of data bus 117. Bypass bus 115 and data bus 117 can have a width at least as wide as data IN (e.g., $n \geq m$).

In one embodiment, port module 110 includes a buffer (e.g., a first-in-first-out [FIFO] buffer) and/or a serial-to-parallel converter. Port module 110 is configured to provide a write control signal 113 (e.g., a write enable signal) to the state machine 120. In an embodiment where the port module 110 includes a FIFO buffer, the FIFO buffer includes a fullness flag (e.g., an indicator of the fullness of the buffer, such as a full flag, a half-full flag, or a partially full flag [for example indicating that one or more blocks or units of the buffer, such as a row, is/are full]) and an empty flag. In a further embodiment, the write control signal 113 is activated when the full flag is active, then the write control signal 113 is deactivated when the empty flag is active. Write control signal 113 is configured to enable the state machine 120 to write data to the OTP memory module 140.

State machine 120 comprises logic configured to perform and/or control programming (e.g., data write) and reading (e.g., data output) functions. State machine 120 is configured to receive write control signal 113 and provide a control signal 123 (e.g., an address and/or OTP select signal) to the OTP memory module 140. In one embodiment, the control signal 123 identifies an OTP memory to which data are written or programmed. In another embodiment, the control signal 123 includes a row, column, and/or block address of an OTP memory to which the data are written.

Additionally, the state machine 120 processes the received data and provides the processed data to OTP memory module 140, which then stores the processed data. State machine 120 also controls programming of the OTP memory module 140 and, optionally, the read-out function of the port logic 150. In one embodiment, the state machine 120 controls whether the data on the bypass bus 115 is read directly by the port logic 150.

The OTP memory module 140 is configured to receive data on bus 125 and the control signal 123, and provide output data 145 and one or more output select signals 143 to port logic 150. OTP memory module 140 comprises a plurality of OTP memories, each configured to be written to once and only once. In various embodiments, the OTP memory module 140 comprises three or more OTP memories (e.g., 3, 4, 5, 6, etc.). The OTP memories may be distinct memories or different blocks within a single (monolithic) OTP memory. The density of each of the plurality of OTP memories is greater than or equal to 2 bits, but preferably at least $2^q$ bits, where q is an integer greater than or equal to 2, such as 3, 4 5, 6, 7 or more. In some embodiments, one bit (e.g., the least significant bit) is reserved for identifying the OTP memory as programmed (e.g., binary state 1) or unprogrammed (e.g., binary state 0).

Each of the plurality of OTP memories has a unique address (to be explained with respect to FIG. 3), and provides an output signal to port logic 150. The output signal(s) from the OTP memory module 140 generally comprise multi-bit (parallel) data 145 and a single-bit or multi-bit output select signal 143. The output select signal 143 is used by the port logic 150 to select a data output from one of the OTP memories. The output data 145 is generally parallel, and is typically at least 2 bits wide (e.g., $2^p$–k bits wide, where p is an integer of at least 2, such as 3, 4, 5, or 6, and k is 0 or an integer of at least 1, such as 1, 2, 3, etc.). In one embodiment, p≦m, and k is 0 or 1. In some embodiments, the multiple programmable memory 100 may comprise a plurality of OTP memory modules 140.

Port logic 150, coupled to both the port module 110 and the OTP memory module 140, reads out the stored data from OTP memory module 140 and provides output data signal OUT. The width of the data signal OUT is generally equal to the width of data signal 145, which is generally equal to the width of the bypass bus 115. In one embodiment, the port logic 150 receives at least one control signal 143 from the OTP memory module 140 to control the read operation(s) of the multiple programmable memory 100.

The multiple programmable memory 100 may be used within one of many different types of applications including, for example, a fan controller 10 as shown in FIG. 1. The fan controller 10 may utilize the multiple programmable memory 100 to store updated parameter or control information. The updated parameter or control information is used by the fan controller 10 to control a fan (not shown). The fan, in turn, is used to cool off certain components of a larger system. For example, the fan may be used to cool off the CPU of a computer system. The fan controller 10 may operate the fan based on certain parameters associated with the CPU. Such parameters might include a desirable operating temperature range for the CPU. The fan controller 10 accordingly monitors and controls the speed of the fan in order to keep the CPU within such temperature range. While a computer system is described above, the fan controller 10 may also be used in other types of systems, such as, a projector, a printer, a microwave oven or any other types of systems that utilize a fan.

The fan controller 10 having the multiple programmable memory 100 is particularly advantageous for certain entities, such as, system integrators and end device manufacturers. These entities typically assemble many types of systems having different components with their corresponding parameters. Therefore, a first fan controller 10 and the fan may need to interoperate with one type of component in a first system and a second fan controller 10 and the fan may need to interoperate with another type of component in a second system. For example, two systems with two different types of CPUs may need two separate fan controllers 10 and their fans. By having the multiple programmable memory 100, each fan controller 10 may be customized or adapted to control the fan based on the parameters associated with the particular component in the system.

The fan controller 10 and the multiple programmable memory 100 may also be used by end users as well to accommodate different types of applications. For example, if a particular system has been reconfigured or its components or functions have otherwise changed, the multiple programmable memory 100 may be updated to include the latest information due to such reconfiguration or change, thereby allowing the fan controller 10 and the fan to continue to operate in a desired and/or optimal manner.

It should be noted that while the fan controller 10 is described above in connection with the multiple programmable memory 100, other types of applications and/or systems may also incorporate the multiple programmable memory 100 based on the disclosure and teachings provided herein.

Figure 2:
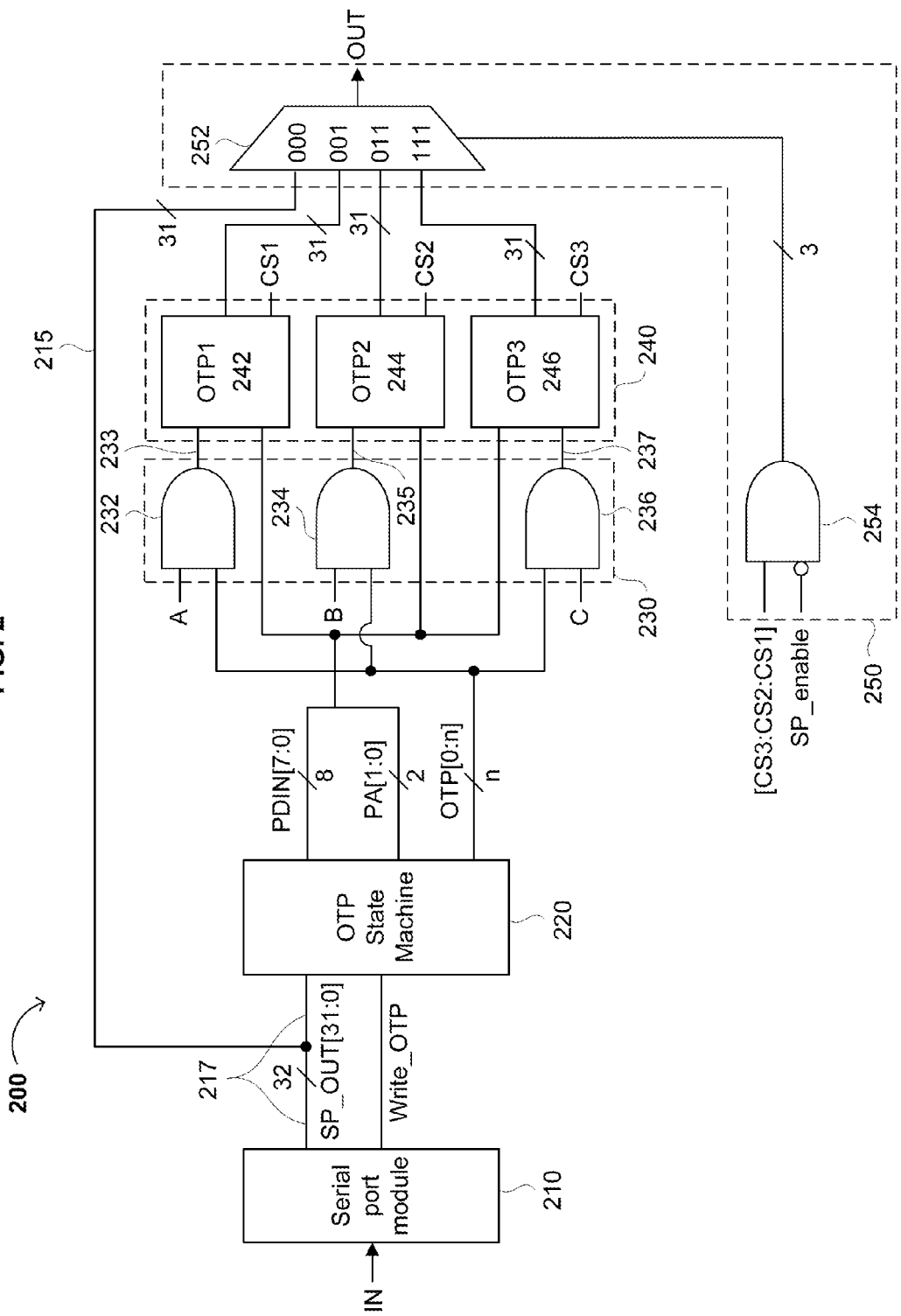
FIG. 2 shows a more detailed diagram of an exemplary multiple programmable memory, consistent with the embodiment of FIG. 1.

FIG. 2 illustrates an exemplary multiple programmable memory apparatus 200 including serial port module 210, OTP state machine 220, input (or programming) logic 230, OTP module 240, and port (or output) logic 250, consistent with the embodiment 100 of FIG. 1. Serial port module 210 is essentially the same as port module 110 in FIG. 1, except that serial port module 210 (FIG. 2) receives a serial data signal IN, and therefore includes a serial-to-parallel converter. Serial port module 210 is coupled to both the OTP state machine 220 (via data bus 217) and the port logic 250 (via bypass bus 215), and is configured to receive a serial data signal IN to be written to an OTP memory 242, 244, or 246. Serial port module 210 is also configured to provide a write enable signal (e.g., Write_OTP) in response to receiving data from the data signal IN. Optionally, when serial port module 210 includes a FIFO buffer, the write enable signal Write_OTP transitions to an active state when the FIFO buffer is full or at least partially full, then transitions back to an inactive state when the FIFO buffer is empty. The serial port module 210 outputs a 32-bit wide data signal SP_OUT [31:0] on data bus 217. Data bus 217 can be any width of at least 2 bits (e.g., 8, 16, 24 bits, etc.). The signal transmitted on the bypass bus 215 is a subset (e.g., the 31 most significant bits) of data signal SP_OUT [31:0].

The OTP state machine 220 is coupled to the serial port module 210, the input logic 230, and the OTP memory module 240. The OTP state machine 220 can be the same as the OTP state machine 120 in FIG. 1. The OTP state machine 220 is configured to receive the data signal SP_OUT [31:0] and the write enable signal Write_OTP from the serial port module 210, and provide an input data signal (e.g., PDIN[7:0]) and an address signal (e.g., PA[1:0]) to the OTP memory module 240. The input data signal is to be written to one of the OTP memories 242, 244, or 246 in the OTP memory module 240, while the address signal PA[1:0] provides an address within the selected OTP memory 242, 244, or 246 for the data to be written. In one embodiment, the address signal PA[1:0] is a row address. In another embodiment, the address signal PA[1:0] is a block address. The address signal may be greater or less than 2 bits, depending on the number of possible locations in each OTP memory 242, 244 or 246 to which data are to be written. Input data signal PDIN[7:0] may be greater than or less than 8 bits wide, in accordance with design choices and tradeoffs.

The OTP state machine 220 is also configured to provide a control signal (e.g., an OTP select signal OTP[0:n]) to input (or programming) logic 230. In one embodiment, the OTP state machine 220 is configured to enable writing received data to an available one of the OTP memories 242, 244, or 246, and indicate an availability of the next OTP memory 242, 244, or 246 (see FIG. 4 and the discussion thereof below).

Input (or programming) logic 230 generally comprises a plurality of logic gates (e.g., AND gates 232, 234, and 236), or any combination of logic devices configured to select an OTP memory to which data are to be written. Additionally, input logic 230 is configured to receive the control signal (e.g., OTP[0:n]) provided by the OTP state machine 220 and OTP availability signals A, B and C. OTP availability signals A, B, and C enable data reception and programming by a predetermined available OTP memory (see the discussion of FIG. 4 below).

As shown in FIG. 2, OTP memory module 240 comprises a plurality of OTP memories 242, 244, and 246. Each of the OTP memories 242, 244, and 246 receives a respective control (e.g., select) signal 233, 235, and 237 provided by the input logic 230. Input logic 230 is configured to enable writing the received data to an available OTP memory. The OTP memories 242, 244 and 246 output programming status (or "chip select") signals CS1:CS3, to be input to output logic 250 and which can be used to indicate the next available OTP memory to be programmed. Additionally, in an alternative embodiment, the state machine 220 enables writing the next received data to a next available OTP memory.

FIG. 3 shows a truth table for selecting the correct (available) OTP memory for programming. As illustrated in FIG. 3, various programming states of the OTP memories (e.g., OTP memories 242, 244, and 246 in FIG. 2) can be used to implement programming the next available OTP memory. Programming status signals CS1:CS3 (the same as programming status signals as CS1:CS3 in FIG. 2) indicate whether the respective OTP memory (e.g., OTP1 242, OTP2 244 or OTP3 246) has been programmed. For example, CS1=0 when OTP1 is not programmed and CS1=1 when OTP1 is programmed; CS2=0 when OTP2 is not programmed and CS2=1 when OTP2 is programmed; and CS3=0 when OTP3 is not programmed and CS3=1 when OTP3 is programmed.

Referring back to FIG. 3, for example, when n=3 (i.e., there are three OTP memories), OTP1 242 is selected when programming status signals CS1:CS3=000 (thereby activating control signal A); OTP2 244 is selected when programming status signals CS1:CS3=100 (thereby activating control signal B); and OTP3 246 is selected when programming status signals CS1:CS3=110 (thereby activating control signal C). It is within the ability of one skilled in the art to design and implement logic configured to activate control signal A, B or C depending on the state of programming status signals CS1:CS3.

Referring now to FIG. 2, prior to the first write operation, CS1:CS3=000, and serial port module 210 provides the first received data IN to OTP state machine 220. OTP state machine 220 then provides the data to input logic 230. Since CS1:CS3=000, input control gate 232 receives an active OTP select signal A, then provides the input data PDIN[7:0] and address PA[1:0] to OTP1 242, where the data are subsequently written. After the data are written in OTP1 242, CS1 changes state. In one embodiment, a bit in OTP1 242 (e.g., the least significant bit) is programmed (e.g., written as a 1) and output as CS1 when the data are written in OTP1 242.

Port logic 250 then selects OTP1 242 to provide output data signal OUT (e.g., when CS3:CS2:CS1=001). Referring to FIG. 3, as subsequent OTP memories are programmed, the OTP memory that is selected changes in succession. For example, when CS1:CS3=110, input control gate 236 (FIG. 2) receives an active OTP select signal C, then provides the input data PDIN[7:0] and address PA[1:0] to OTP1 246, where the data is subsequently written.

When no OTP memory is available to receive data (i.e., all of the OTP memories 242-246 are programmed), the multiple programmable memory 200 can provide the output from the most recently programmed OTP memory as output data signal OUT. No further data can be programmed. However, the bypass bus 215 can be selected when CS1:CS3=111 and the data on bypass bus 215 provided as output data signal OUT if other data is to be programmed into and/or read from the multiple programmable memory 200, as described below.

Port logic 250 is coupled to each of the OTP memories 242, 244, and 246 and is configured to receive a plurality of OTP memory programming status signals (e.g., CS1:CS3) and a read enable signal (e.g., SP_enable). Port logic 250 comprises a multiplexer 252 and a logic gate 254. Logic gate 254 is configured to receive the programming status signals (e.g., CS1:CS3) from OTP memory module 240 and the read enable signal (e.g., SP_enable). The read enable signal can be provided from an external source (e.g., a microcontroller or microprocessor). Multiplexer 252 is configured to select an output to be provided as output data signal OUT, depending on the values of the programming status signals and the read enable signal received.

Figure 4:
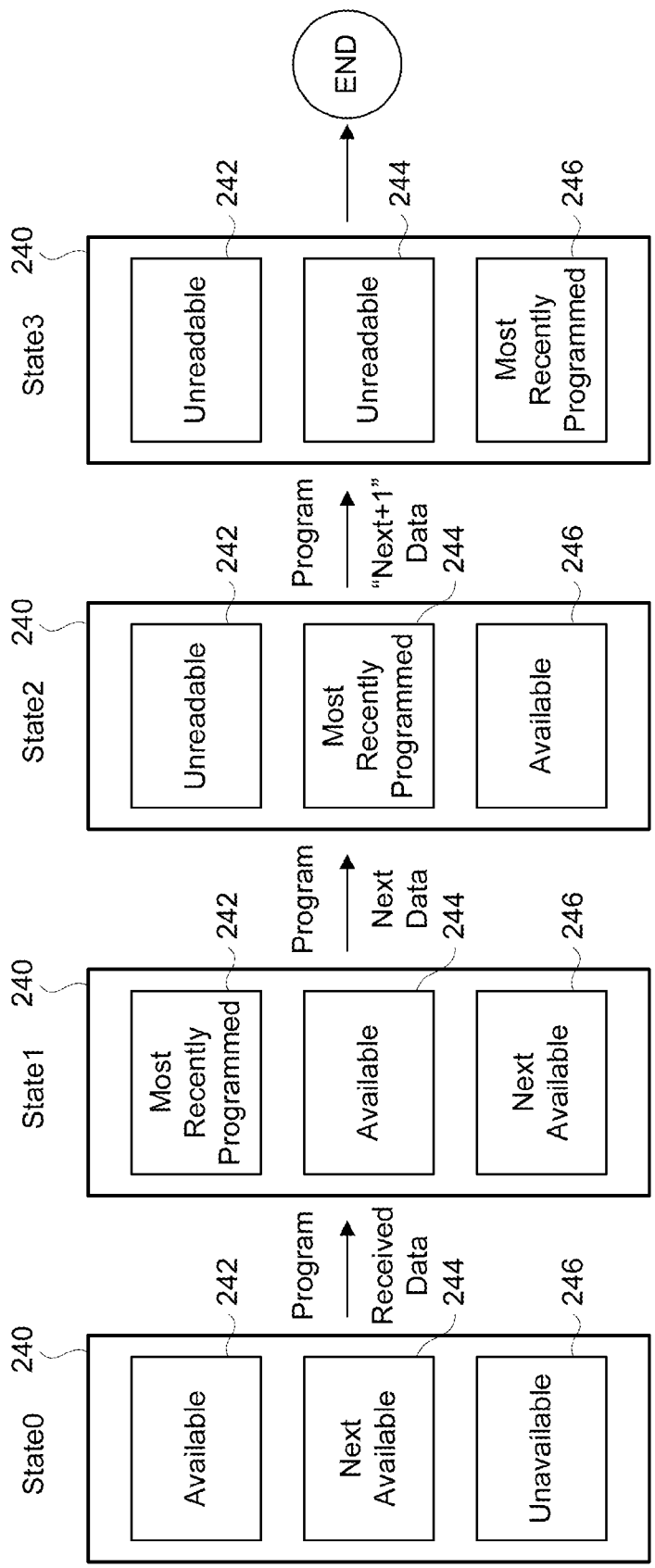
FIG. 4 is a diagram showing various states of OTP memories in the exemplary OTP module of FIG. 2 according to an embodiment.

FIG. 4 shows various states of the exemplary OTP memory module 240 of FIG. 2. As shown in FIG. 4, OTP memory module 240 includes a plurality of OTP memories 242, 244 and 246 for data to be written. State0 is a default configuration or state, prior to the first data write cycle, in which OTP memory module 240 comprises an available OTP memory 242, a next available OTP memory 244, and an unavailable OTP memory 246. Upon receiving data to be programmed or written, the multiple programmable memory (e.g., memory 100 in FIG. 1 or memory 200 in FIG. 2) writes the received data in the available OTP memory 242. After the first write operation has been completed, the OTP memory module 240 proceeds to State1.

At State1, OTP memory 242 is the most recently programmed OTP memory, OTP memory 244 becomes an available OTP memory, and OTP memory 246 becomes the next available OTP memory in the OTP memory module 240. Because OTP memory 242 has data programmed therein, OTP memory 242 cannot receive additional data or be further programmed. Therefore, upon receiving the next block of data to be written into OTP memory module 240, the received data is written to or programmed in available OTP memory 244. OTP memory module 240 then proceeds to State2.

At State2, OTP memory 242 becomes unreadable, since it is no longer the most recently programmed OTP memory in the OTP memory module 240. OTP memory 244 is the most recently programmed OTP memory, and OTP memory 246 becomes an available OTP memory. Because OTP memories 242 and 244 have data programmed therein, OTP memories 242 and 244 cannot receive additional data or be further programmed. Therefore, upon OTP memory module 240 receiving the next block of data to be written (e.g., "Next+1" data), the received data is written to or programmed in available OTP memory 246. OTP memory module 240 then proceeds to State3.

At State3, OTP memory 242 remains unreadable, OTP memory 244 becomes unreadable, and OTP memory 246 becomes the most recently programmed OTP memory. Thus, all of the memories in OTP memory module 240 have been written to or programmed in State3, and no OTP memories are available (e.g., to be written or programmed). OTP memory module 240 continues to provide the output data signal from the most recently programmed OTP memory 246 as output data signal OUT. However, in further embodiments including additional available OTP memories, additional data received by multiple programmable memory 100 (FIG. 1) or multiple programmable memory 200 (FIG. 2) is written to or programmed in the available OTP memory, while data are read from the most recently programmed OTP memory.

Referring back to FIG. 2, port logic 250 is also in communication with the serial port module 210 and can receive a data signal (e.g., on bypass bus 215) and provide the received data as output data signal OUT under certain conditions. Specifically, port logic 250 is configured to receive the data signal on bypass bus 215 upon receiving a bypass enable signal (not shown) and/or a write enable signal (e.g., Write_OTP). The bypass enable signal is configured to enable port logic 250 to select data from bypass bus 215 to provide as output data signal OUT. The write enable signal (e.g., Write_OTP) communicates to port logic 250 that a new data block has been received, and is to be written to an available OTP memory. However, when all of the OTP memories 242, 244, and 246 have been programmed, no OTP memory remains available for programming, and it is not possible to program the data into the OTP memory module 240. As a result, either the write enable signal can be used directly, or the bypass enable signal can be activated, when all of the OTP memories 242, 244, and 246 have been programmed and more data is to be written to or read from the multiple programmable memory 200, and the data on bypass bus 215 is then provided as output data signal OUT.

In one embodiment, the bypass enable signal is provided by serial port module 210. In another embodiment, the bypass enable signal is provided by a data bus counter (e.g., in the OTP state machine 220 and which counts the number of OTP memories programmed), and the bypass enable signal is generated upon completion of the write cycle of the last available OTP memory. Furthermore, in such an embodiment, the OTP state machine 220 comprises the data bus counter, which itself can comprise a plurality of non-volatile memory bits (e.g., OTP memory bits, generally in a number about equal to the number of OTP memories). Thus, in such an embodiment, when OTP programming bits CS1:CS3=111, the port logic 250 selects the data signal on bypass bus 215 to provide as output data signal OUT.

Figure 5:
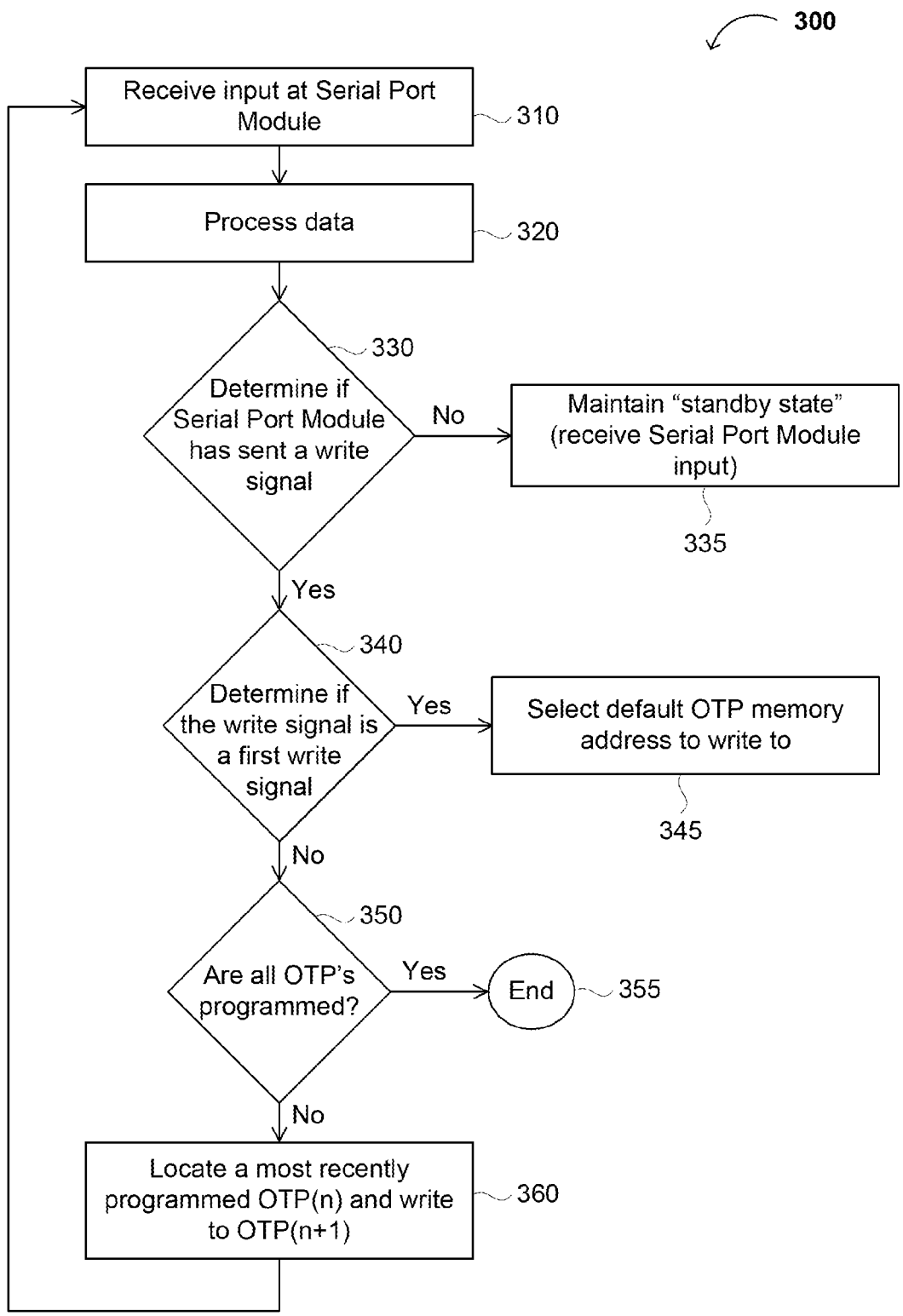
FIG. 5 is a flow diagram showing an exemplary method of programming and reprogramming a multiple programmable memory having an OTP memory module according to an embodiment.

Exemplary Method(s) for Reprogramming and Reading a Multiple Programmable Memory A further aspect of the invention relates to a method of using a multiple programmable memory that includes a plurality of OTP memories. FIG. 5 shows a flow chart 300 illustrating an exemplary method of programming, reprogramming, and reading a multiple programmable memory (e.g., the multiple programmable memory 100 of FIG. 1 or the multiple programmable memory 200 of FIG. 2).

At 310, data is received at a serial port module (e.g., serial port module 210 in FIG. 2). At 320 in FIG. 5, the serial port module subsequently processes the received data. For example, the data can be stored in a buffer (e.g., a FIFO buffer), and a write enable signal can be generated when the buffer has received a predetermined amount of data (e.g., corresponding to the full or partially-full flag). At 330, the method determines if the serial port module has sent a write signal (e.g., write enable signal Write_OTP in FIG. 2). If a write signal has not been sent, then the method proceeds to 335 and maintains a "standby state" (i.e., the serial port module remains ready to receive data, and the state machine does not change state).

If a write signal has been sent, then the method proceeds to 340 and determines if the write signal is a first write signal. Logic can be configured to determine if the write signal is the first write signal. For example, the logic can comprise a counter or a block of non-volatile memory in a state machine, such as the state machine 120 in FIG. 1 or the OTP state machine 220 in FIG. 2. If the write signal is the first write signal, then the method proceeds to 345 and selects a default OTP memory to which to write (or program) the received data. For example, the state machine can be configured to select a default OTP memory to program data. However, if the write signal is not the first write signal, then the method proceeds to 350 and determines if all OTP memories have been programmed (e.g., using a counter or non-volatile memory bits in the state machine). If all OTP memories have been programmed (e.g., the counter has reached its counter limit or all non-volatile memory bits have been programmed), then the method proceeds to 355 and ends. At 355, the state machine does not change state, no OTP memories are programmed, and optionally, any received data to be written to the OTP memory module is instead read as output data (e.g., from a buffer in the serial port module). If all OTP memories have not been programmed, then the method proceeds to step 360.

At 360, the method identifies the most recently programmed OTP memory, and writes to the next available OTP memory. For example, if OTP1 is the most recently programmed OTP memory, then data is written to OTP2. Once the received data has been written to the next available OTP memory, the method returns to the beginning (310) and awaits receipt of the next block of data to program in the multiple programmable memory.

Another Exemplary Circuit and Architecture

Figure 6:
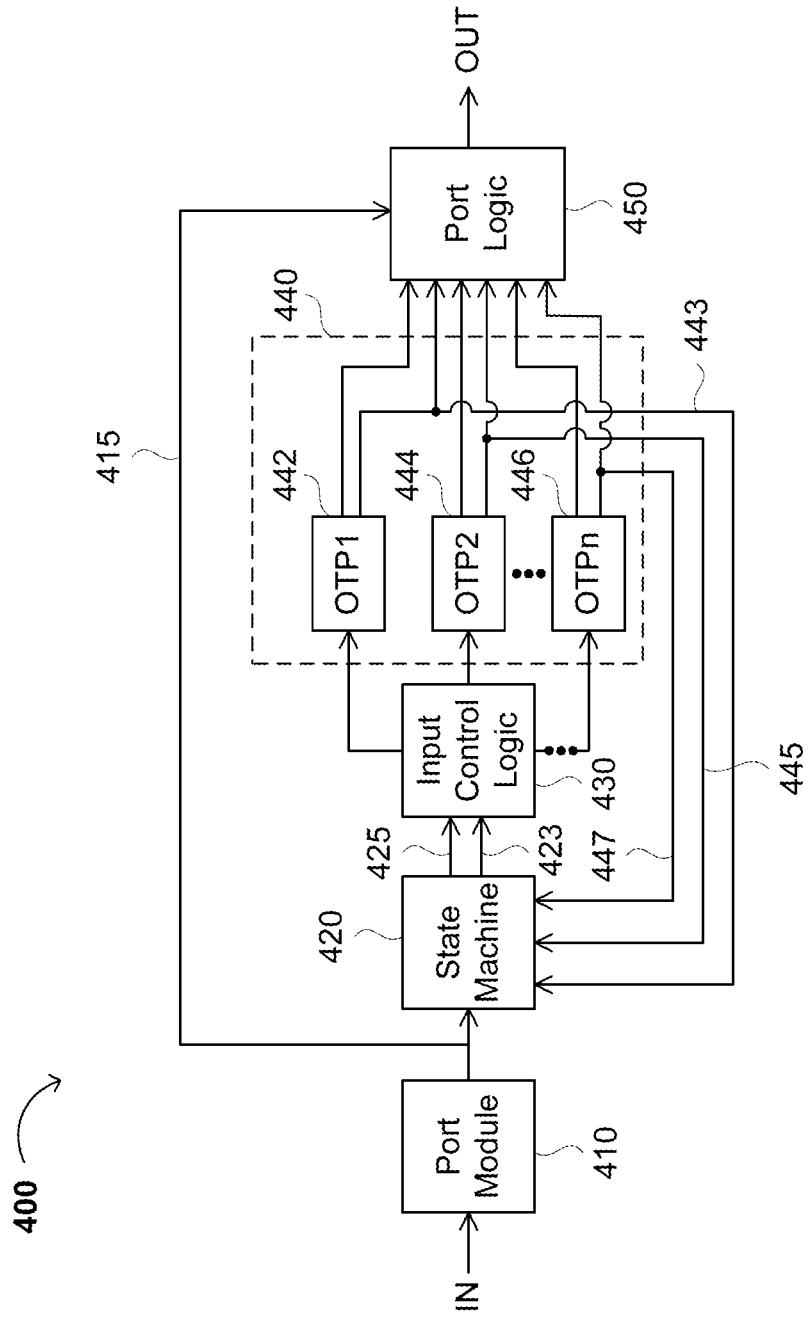
FIG. 6 is a block diagram showing a multiple programmable memory with an OTP memory module according to another exemplary embodiment.

FIG. 6 illustrates a block level architecture for an exemplary multiple programmable memory 400, similar to multiple programmable memory 100 in FIG. 1, but in which feedback signals 443, 445, and 447 from the OTP memory module 440 are received by state machine 420. Feedback signals 443, 445, and 447 provide the state machine 420 with information configured to enable identification of the next OTP memory (e.g., 442, 444, or 446) to be programmed or written. The port module 410, the port logic 450, and the input logic 430 in FIG. 6 can be the same as the port module 210, the port logic 250, and the input logic 230 in FIG. 2, respectively. The state machine 420 and the OTP memory module 440 are essentially the same as the OTP state machine 220 and the OTP memory module 240 in FIG. 2, respectively.

Like the multiple programmable memory 100 in FIG. 1, the port module 410 is connected to the state machine 420 and the port logic 450. State machine 420 is configured to process received data from the port module 410 and provide the processed data to the input logic 430. State machine 420 is also configured to receive feedback signals 443, 445, and 447 indicative of the next OTP memory 442, 444, or 446 to which the next received data are to be written. Additionally, state machine 420 controls programming of the OTP memory module 440 and the read-out function of the port logic 450. Alternatively, the OTP memory module 440 can, in various embodiments, provide one or more control signals to the port logic 450 to control the read operations of the multiple programmable memory 400.

Input logic 430 is coupled between the state machine 420 and the OTP memory module 440, which comprises a plurality of OTP memories (e.g., 442, 444, and 446). OTP memories 442, 444, and 446 are configured to receive one or more address and/or control signals (not shown) from the input logic 430. In one embodiment, the input logic 430 is configured to receive an OTP select signal from the state machine 420. Port logic 450, coupled to the OTP memory module 440, is configured to read an output from the most recently programmed OTP memory 442, 444, or 446 and provide output data signal OUT therefrom.

Figure 7:
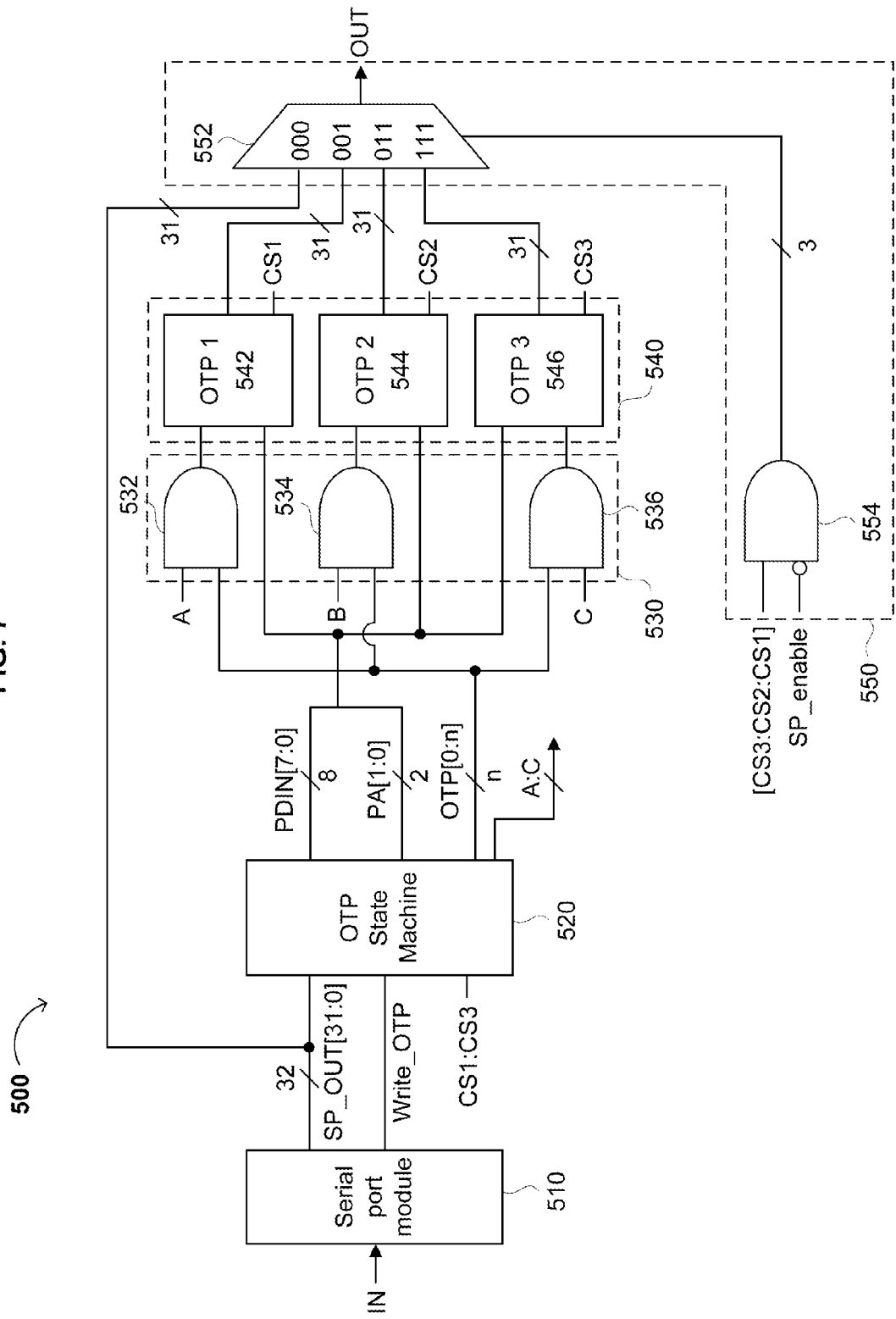
FIG. 7 shows a more detailed diagram of an exemplary multiple programmable memory consistent with the embodiment of FIG. 6.

FIG. 7 illustrates an exemplary multiple programmable memory 500 including OTP memory module 540 in more detail. The multiple programmable memory 500 is similar to that of FIG. 2, except for additional connections provided to and from the OTP state machine 520. The serial port module 510 in FIG. 7, and thus the output signals (e.g., SP_OUT [31:0]) and write enable signal (e.g., Write_OTP) of serial port module 510, can be the same as the serial port module 210 and the output signals and write enable signal of serial port module 210 in FIG. 2, respectively. Additionally, the input (or programming) logic 530, OTP memory module 540, and read logic 550 in FIG. 7 can be the same as the input (or programming) logic 230, OTP memory module 240, and port logic 250, respectively, in FIG. 2. Therefore, the various input and output signals (e.g., PDIN[7:0], PA[1:0], CS1:CS3) in FIG. 7 can be the same as those in FIG. 2.

Specifically, however, the OTP state machine 520 is configured to receive the OTP programming status signals CS1:CS3 from the OTP memory module 540. In one embodiment, OTP programming status signals CS1:CS3 (which correspond to the signals 443, 445, and 447 identified in FIG. 6) provide the OTP state machine 520 with data that enables identification of the next OTP memory (e.g., 542, 544, or 546) to be programmed or written, in accordance with FIG. 3. Thus, the multiple programmable memory 500 of FIG. 7 does not require non-volatile memory or a counter in the state machine 520 to identify either the available memory or the next available memory for programming. Additionally, the OTP state machine 520 is configured to provide control signals A:C based on values of OTP programming status signals CS1:CS3 (see FIG. 3). Control signals A:C are received by the input logic 530 to select an available OTP memory 542, 544, or 546 for programming the received data, in accordance with FIG. 3.

Figure 8:
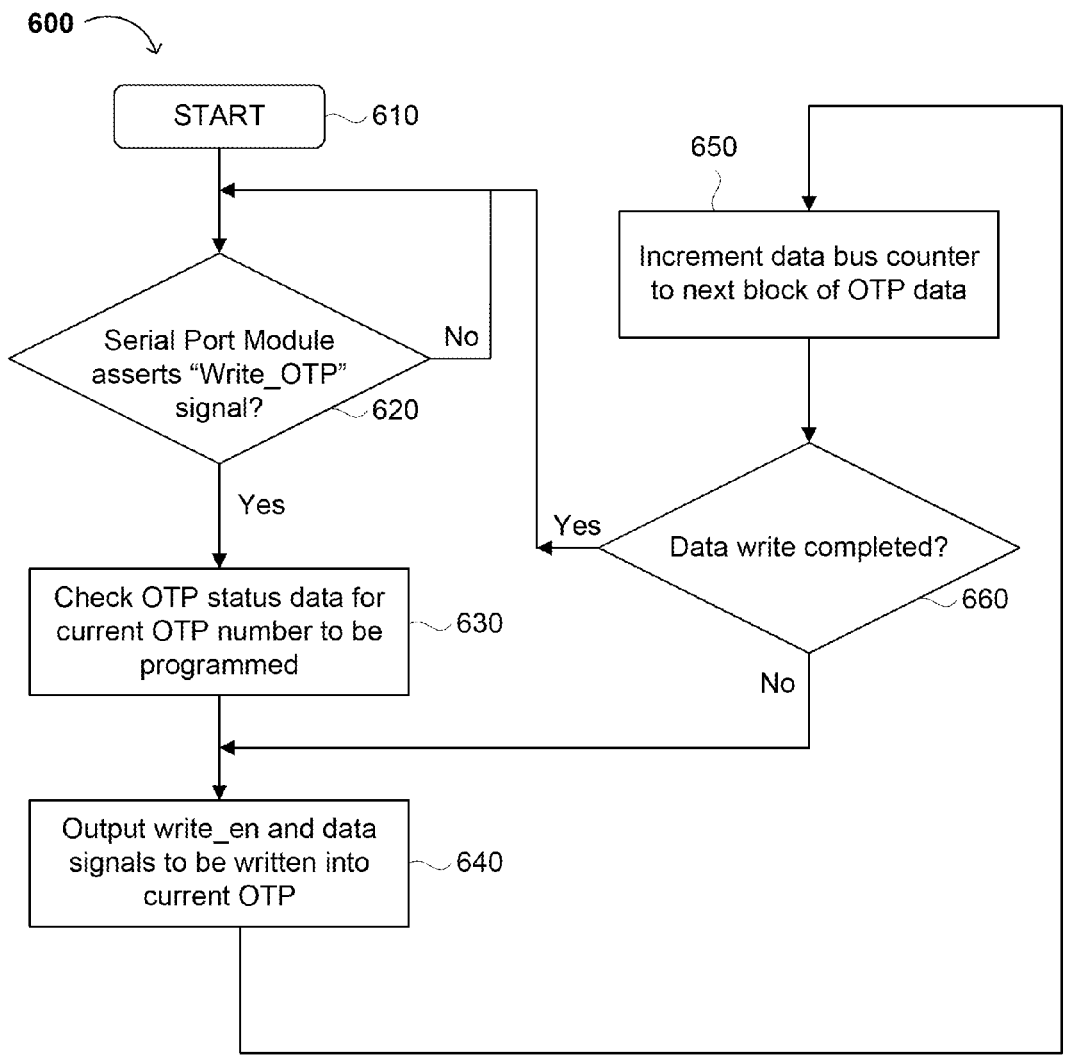
FIG. 8 is a flow diagram showing another exemplary method of utilizing the multiple programmable memory according to another exemplary embodiment.

Another Exemplary Method for Reprogramming and Reading a Multiple Programmable Memory FIG. 8 shows a flow chart 600 illustrating a second exemplary method of using a multiple programmable memory that includes a plurality of OTP memories. At 610, the method begins, and at 620, if the serial port module (e.g., serial port module 410 in FIG. 6 or serial port module 510 in FIG. 7) asserts a "Write_OTP" signal, then at 630, the OTP status data (e.g., programming status signals CS1:CS3 in FIG. 7) is checked to identify a current (or available) OTP memory to be programmed. If the serial port module is not asserting a write control signal (e.g., "Write_OTP" in FIG. 7), then the serial port module remains ready to receive data.

At 640, after the OTP memory to be programmed (e.g., the available OTP memory) has been identified, a write enable signal (e.g., "write_en") is asserted, and the data is then written into the available OTP memory. At 650, a data bus counter (e.g., a least significant bit or most significant bit in an OTP memory, or a non-volatile memory bit in a state machine such as OTP state machine 520 in FIG. 7) is incremented to indicate the address of the next available OTP memory and count the number of the blocks of data written to the OTP memory module (e.g., 540 in FIG. 7). At 660, if the data write process (e.g., OTP memory programming operation) is complete, the method returns to start 610. If the data write process is not complete, then the write enable signal (e.g., write_en) remains asserted, and the data continues to be written into the available OTP memory.

Exemplary Software

The present invention also includes algorithms, computer program(s) and/or software, implementable and/or executable in a general purpose computer or workstation equipped with a conventional digital signal processor, configured to perform one or more steps of the method and/or one or more operations of the hardware. Thus, a further aspect of the invention relates to algorithms and/or software that implement the above method(s). For example, the invention may further relate to a computer program, computer-readable medium or waveform containing a set of instructions which, when executed by an appropriate processing device (e.g., a signal processing device, such as a microcontroller, microprocessor or DSP device), is configured to perform the above-described method and/or algorithm.

For example, the computer program may be on any kind of readable medium, and the computer-readable medium may comprise any physical or tangible medium that can be read by a processing device configured to read the medium and execute code stored thereon or therein, such as a floppy disk, CD-ROM, magnetic tape or hard disk drive. Such code may comprise object code, source code and/or binary code.

The waveform is generally configured for transmission through an appropriate medium, such as copper wire, a conventional twisted pair wireline, a conventional network cable, a conventional optical data transmission cable, or even air or a vacuum (e.g., outer space) for wireless signal transmissions. The waveform and/or code for implementing the present method(s) are generally digital, and are generally configured for processing by a conventional digital data processor (e.g., a microprocessor, microcontroller, or logic circuit such as a programmable gate array, programmable logic circuit/device or application-specific [integrated] circuit).

In various embodiments, the computer-readable medium or waveform comprises at least one instruction to (i) receive first data to be written to a non-volatile memory; (ii) program, once and only once, a plurality of one-time programmable (OTP) memories with the received data; (iii) indicate an availability of a next one of the plurality of OTP memories; and (iv) read an output from the programmed one of the plurality of OTP memories. In further embodiments, the present computer-readable medium or waveform may be adapted to store the received data in a buffer and indicate the fullness of the buffer. The computer-readable medium or waveform may include an instruction to assert a write enable signal while a fullness flag of the buffer is asserted, then de-assert the write enable signal when an empty flag of the buffer is asserted. The present computer-readable medium or waveform may also be adapted to select a next one of the plurality of OTP memories after an available OTP memory is programmed.

The set of instructions may also comprise at least one instruction adapted to read an output from a most recently programmed one of the plurality of OTP memories. Additionally, the set of instructions may comprise instructions adapted to select a default OTP memory when none of the OTP memories have been programmed.

CONCLUSION/SUMMARY

Thus, embodiments of the present disclosure provide a circuit, architecture, system and method for programming, reprogramming and reading a multiple programmable memory using a plurality of OTP memories. The present multiple programmable memory enables multiple OTP memories to function as a reprogrammable memory when a limited number of reprogramming cycles are needed or desired. Such reprogrammable memory is good for configuring configurable ICs that utilize data that is not changed frequently during the lifetime of a product (e.g., a simple three-phase motor controller; the output drive strength of an output driver; a frequency range of a clock circuit; etc.).

The foregoing descriptions of embodiments of the present disclosure have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A controller comprising:
   a plurality of one-time programmable (OTP) memories configured to store parameter information corresponding to a device, the parameter information being used by the controller to control the device, wherein each of the plurality of OTP memories is capable of being programmed once and only once; and
   a state machine configured to enable writing updated parameter information to an available one of the plurality of OTP memories and to provide an OTP select signal indicating a next one of the plurality of OTP memories to which next updated parameter information is to be written, wherein the updated parameter information is written to the available OTP memory when operation of the device is to be adjusted.

2. The controller of claim 1, further comprising port logic coupled to the plurality of OTP memories and configured to provide an output from a most recently programmed one of the plurality of OTP memories.

3. The controller of claim 2, further comprising a port module configured to receive the updated parameter information and provide the updated parameter information to the state machine.

4. The controller of claim 3, further comprising a bypass bus configured to transfer the updated parameter information from the port module directly to the port logic.

5. The controller of claim 2, wherein the OTP select signal is further configured to indicate a default OTP memory when none of the plurality of OTP memories are programmed.

6. The controller of claim 2, further comprising input logic configured to receive the OTP select signal, write the updated parameter information to the available one of the plurality of OTP memories, and enable writing the next updated parameter information to the next one of the plurality of OTP memories.

7. The controller of claim 6, wherein each of the plurality of OTP memories provides an OTP programming status indicator, and the OTP programming status indicators are received by (i) the port logic to select the most recently programmed OTP memory, and (ii) the state machine to indicate the availability of the next one of the plurality of OTP memories.

8. The controller of claim 7, wherein the port logic comprises a multiplexer configured to receive an output from each of the OTP memories, and a logic gate configured to select the most recently programmed OTP memory based on the OTP programming status indicators.

9. The controller of claim 1, wherein the state machine comprises a counter and/or nonvolatile memory bits configured to count or otherwise indicate a number of OTP memory programming cycles.

10. A method for updating a device controller, the method comprising:
    receiving updated parameter information, wherein the updated parameter information is used by the device controller to control a device and is received when operation of the device is to be adjusted;
    programming an available one of a plurality of one-time programmable (OTP) memories with the updated parameter information; and
    indicating an availability of a next one of the plurality of OTP memories.

11. The method of claim 10 further comprising reading an output from a most recently programmed one of the plurality of OTP memories.

12. The method of claim 10, further comprising programming a memory bit to indicate a programmed OTP memory.

13. The method of claim 10, wherein each of the plurality of OTP memories is configured to provide an output select signal.

14. The method of claim 10, further comprising programming a default OTP memory when none of the OTP memories have been programmed.

15. The method of claim 10, further comprising determining if all of the plurality of OTP memories have been programmed.

16. The method of claim 10, further comprising locating the most recently programmed one of the plurality of OTP memories and writing to the next one of the plurality of OTP memories.

17. The method of claim 10, further comprising incrementing a counter or programming a memory bit when a block of data is written to one of the plurality of OTP memories.

18. The method of claim 10, further comprising converting the updated parameter information from serial data to parallel data.

19. A computer-readable medium comprising a computer-executable set of instructions stored therein, the instructions adapted to:
    receive updated parameter information, wherein the updated parameter information is used by a device controller to control a device and is received when operation of the device is to be adjusted;
    program an available one of a plurality of one-time programmable (OTP) memories with the updated parameter information;
    indicate a next one of the plurality of OTP memories to be programmed with next received data; and
    read an output from a most recently programmed one of the plurality of OTP memories.

20. The computer-readable medium of claim 19, wherein the computer-executable set of instructions is further adapted to determine a number of programmed OTP memories and indicate the most recently programmed one and the next one of the plurality of OTP memories from the number of programmed OTP memories.

* * * * *